United States Patent
Lin et al.

(10) Patent No.: US 9,660,188 B2
(45) Date of Patent: May 23, 2017

(54) PHASE CHANGE MEMORY STRUCTURE TO REDUCE LEAKAGE FROM THE HEATING ELEMENT TO THE SURROUNDING MATERIAL

(71) Applicant: Taiwan Semiconductor Manufacturing Co., Ltd., Hsin-Chu (TW)

(72) Inventors: Po-ken Lin, Hsinchu (TW); Chang-Ming Wu, New Taipei (TW); Chern-Yow Hsu, Chu-Bei (TW); Shih-Chang Liu, Alian Township (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 84 days.

(21) Appl. No.: 14/471,082

(22) Filed: Aug. 28, 2014

(65) Prior Publication Data
US 2016/0064656 A1    Mar. 3, 2016

(51) Int. Cl.
*H01L 29/02* (2006.01)
*H01L 47/00* (2006.01)
*H01L 45/00* (2006.01)
*H01L 27/24* (2006.01)

(52) U.S. Cl.
CPC .......... *H01L 45/06* (2013.01); *H01L 27/2436* (2013.01); *H01L 45/1286* (2013.01); *H01L 45/1675* (2013.01)

(58) Field of Classification Search
CPC ..... H01L 45/06; H01L 45/144; H01L 45/126; H01L 45/1293; G11C 13/0004; G11C 13/0007

USPC .................................................. 257/2, 3, 4, 5
See application file for complete search history.

(56) References Cited

U.S. PATENT DOCUMENTS

| | | | |
|---|---|---|---|
| 6,617,192 B1 * | 9/2003 | Lowrey ................. | G11C 11/56 257/3 |
| 6,815,704 B1 * | 11/2004 | Chen ..................... | H01L 45/06 257/2 |
| 7,687,794 B2 | 3/2010 | Liu et al. | |
| 8,049,196 B2 * | 11/2011 | Jung ..................... | H01L 27/2409 257/2 |
| 8,084,760 B2 * | 12/2011 | Lung .................... | G11C 13/0004 257/2 |
| 8,680,504 B2 * | 3/2014 | Li ....................... | G11C 13/0004 257/2 |
| 2005/0098811 A1 * | 5/2005 | Ogiwara ............ | G11C 13/0004 257/295 |

(Continued)

*Primary Examiner* — David Chen
(74) *Attorney, Agent, or Firm* — Eschweiler & Potashnik, LLC

(57) ABSTRACT

A phase change memory (PCM) cell with a heating element electrically isolated from laterally surrounding regions of the PCM cell by a cavity is provided. A dielectric region is arranged between first and second conductors. A heating plug is arranged within a hole extending through the dielectric region to the first conductor. The heating plug includes a heating element running along sidewalls of the hole, and includes a sidewall structure including a cavity arranged between the heating element and the sidewalls. A phase change element is in thermal communication with the heating plug and arranged between the heating plug and the second conductor. Also provide is a method for manufacturing the PCM cell.

16 Claims, 12 Drawing Sheets

(56) References Cited

U.S. PATENT DOCUMENTS

| | | | |
|---|---|---|---|
| 2005/0111247 A1* | 5/2005 | Takaura | H01L 27/2472 365/2 |
| 2007/0246440 A1* | 10/2007 | Sato | H01L 27/2436 216/41 |
| 2008/0014733 A1* | 1/2008 | Liu | H01L 27/2463 438/597 |
| 2008/0237565 A1* | 10/2008 | Chang | H01L 27/2463 257/4 |
| 2008/0265238 A1* | 10/2008 | Chen | H01L 45/06 257/3 |
| 2008/0277642 A1* | 11/2008 | In T Zandt | H01L 45/06 257/4 |
| 2008/0304310 A1* | 12/2008 | Philipp | H01L 27/2436 365/148 |
| 2009/0008621 A1* | 1/2009 | Lin | H01L 45/06 257/3 |
| 2011/0068313 A1* | 3/2011 | Liu | H01L 27/101 257/4 |
| 2011/0266511 A1* | 11/2011 | Shen | H01L 45/06 257/3 |
| 2014/0166970 A1 | 6/2014 | Shen et al. | |

* cited by examiner

PHASE CHANGE MEMORY STRUCTURE TO REDUCE LEAKAGE FROM THE HEATING ELEMENT TO THE SURROUNDING MATERIAL

BACKGROUND

Phase change memory (PCM) is a type of nonvolatile memory in which a variable phase of a phase change element is employed to represent a unit of data, such as a bit of data. By reversibly switching the variable phase between a crystalline state and an amorphous state, the data state of the data unit can be switched. The variable phase of the phase change element can be reversibly switched by, for example, the application of different heating levels corresponding to the different phase states. Phase change memory is also known as phase random access memory (PRAM), phase change random access memory (PCRAM), ovonic unified memory, chalcogenide random access memory (or C-RAM), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
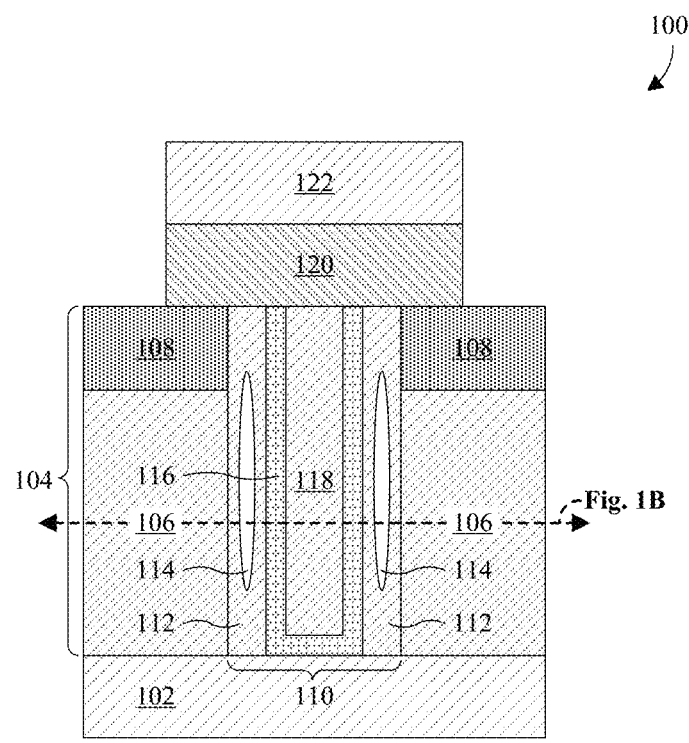
FIG. 1A illustrates a cross-sectional view of some embodiments of a semiconductor structure for a phase change memory (PCM) cell with a heating element electrically isolated from laterally surrounding regions of the PCM cell by a cavity.
Figure 1B:
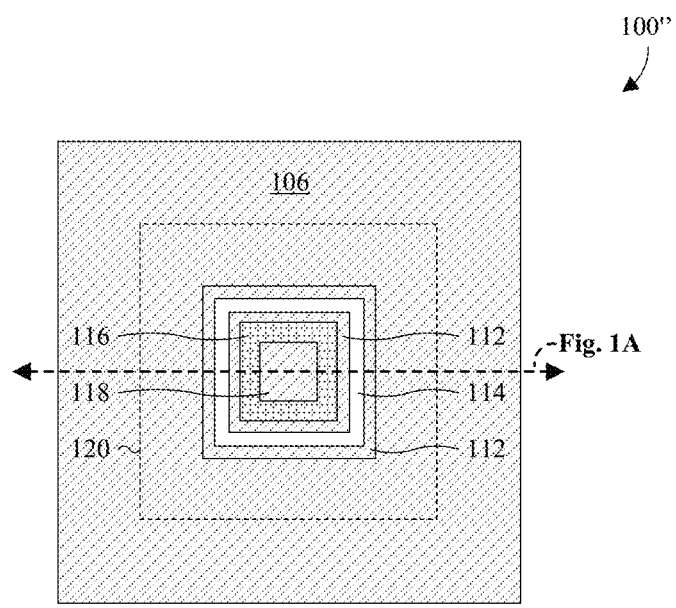
FIG. 1B illustrates a top view of some embodiments of the semiconductor structure of FIG. 1A.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. For example, "a first dielectric layer" described in connection with FIGS. 1A & B may not correspond to "a first dielectric layer" described in connection with FIGS. 2A & B.

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which the variable phase of a phase change element is employed to represent a unit of data, such as a bit of data. By reversibly switching between crystalline and amorphous states of the phase change element, the data state of the data unit can be switched. Relative to other types of nonvolatile memory, such as flash memory, PCM is generally recognized as having faster read and write times, lower operating voltages, and a higher number (e.g., about one trillion) of read and write cycles.

A PCM cell typically includes a phase change element arranged over a heating element and an insulating structure surrounding and abutting the heating element. Further, a top conductor of the PCM cell is arranged over the phase change element, and a bottom conductor of the PCM cell is arranged below the heating element. A challenge with conventional semiconductor structures for a PCM cell is the leakage of charge (i.e., leakage current) from the heating element. Leakage reduces the energy efficiency of the PCM cell and limits the size of the PCM cell since additional insulation is needed around the heating element to accommodate the leakage. Under conventional semiconductor structures for a PCM cell, the majority of charge leaks from the heating element to regions of the PCM cell laterally surrounding the heating element or to regions of the PCM cell below the heating element.

In view of the foregoing, the present application is directed to an improved semiconductor structure for a PCM cell that reduces the leakage of charge from the heating element. The improved semiconductor structure includes cavities (e.g., air gaps) arranged around sidewalls of the heating element between the sidewalls and the insulating structure. The cavities or gaps advantageously reduce the leakage of charge from the heating element to the laterally surrounding regions of the PCM cell by isolating the laterally surrounding regions from the sidewalls. In this way, the improved semiconductor structure reduces the leakage of charge from the heating element.

With reference to FIGS. 1A & B, cross-sectional and top views 100', 100" are respectively provided for some embodiments of a semiconductor structure for a PCM cell. The PCM cell includes a bottom conductor 102 over which an insulating structure 104 of the PCM cell is arranged. The bottom conductor 102 is or otherwise includes, for example, polysilicon, tungsten, or copper. The insulating structure 104 includes a first dielectric layer 106 arranged over, and typically abutting, the bottom conductor 102 and a second dielectric layer 108 arranged over, and typically abutting, the first dielectric layer 106. The first dielectric layer 106 is or otherwise includes, for example, silicon dioxide, and the second dielectric layer 108 is or otherwise includes, for example, silicon nitride.

A heating plug 110 of the PCM cell extends vertically through a through hole in the insulating structure 104 between top and bottom surfaces of the insulating structure 104. The projection of the through hole onto the top surface of the bottom conductor 102 can take any shape, such as such as, for example, a rectangle, a circle, a square, a triangle, a rectangular ring, a circular ring, a square ring, or a triangular ring.

A sidewall structure 112 of the heating plug 110 lines sidewalls of the through hole, and includes one or more cavities 114 arranged within the sidewall structure 112. Typically, the cavities 114 include a cavity for each continuous region of the sidewall structure 112. For example, where the projection of the through hole is ring shaped, the sidewall structure 112 includes two continuous regions, and where the projection of the through hole is rectangular, circular, square, or triangular, the sidewall structure 112 includes a single continuous region. The cavities 114 are filled with a gas, such as, for example, air or nitrogen, and, in some embodiments, the cavities 114 are hermetically sealed. The cavities 114 advantageously serve as an electrical isolation region and/or, in some embodiments, an air gap to prevent leakage of charge to regions of the PCM cell surrounding the sidewall structure 112. The sidewall structure 112 has, for example, a ratio of height to width between about four and nine. Further, the sidewall structure 112 has, for example, a thickness of about 200-600 Angstroms and/or is or otherwise includes a dielectric, such as, for example, silicon dioxide, silicon nitride, or silicon oxynitride.

A heating element 116 of the heating plug 110 is arranged in the through hole in electrical communication with the bottom conductor 102. Typically, the heating element 116 conformally lines the sidewalls of the sidewall structure 112 and regions of the bottom conductor top surface below the through hole. Further, the heating element 116 typically abuts the bottom conductor 102. When a voltage is applied across the heating element 116, the heating element 116 generates heat in proportion to the applied voltage. The heating element 116 is or otherwise includes, for example, titanium nitride.

A dielectric core 118 of the heating plug 110 is arranged over and between the heating element 116 to fill regions of the through hole not taken up by the sidewall structure 112 and the heating element 116. The dielectric core 118 electrically isolates opposing sides of the heating element 116 and is or otherwise includes, for example, silicon dioxide, silicon nitride, or silicon oxynitride.

A phase change element 120 of the PCM cell is arranged over, typically abutting, the insulating structure 104 and the heating plug 110. The phase change element 120 includes a variable phase representing a unit of data, such as a bit of data. The variable phase includes different phase states corresponding to different data states of the data unit. For example, the variable phase includes a crystalline state corresponding to a data state of "1", and includes an amorphous state corresponding to a data state of "0". The phase change element 120 further includes a variable resistance which changes between different resistance states depending upon the phase state of the variable phase. The phase change element 120 is or otherwise includes a chalcogenide compound, such as, for example, $Ge_2Sb_2Te_5$ (GST), Ge—In—Sb—Te (GIST), or Ag—In—Sb—Te (AIST).

A top conductor 122 is arranged over the phase change element 120 in electrical communication with the phase change element 120. The top conductor 122 is, for example, polysilicon, tungsten, or copper.

In operation of the PCM cell, the data unit of the phase change element 120 is represented by the variable phase of the phase change element 120. The variable phase of the phase change element 120 is manipulated through application of heat to the phase change element 120 with the heating plug 110. Depending on the amount of heat applied, the variable phase undergoes a reversible change between different phase states. For example, when a first heating level is applied to the phase change element 120, the phase change element 120 enters a crystalline state, and when a second heating level is applied to the phase change element 120, the phase change element 120 enters an amorphous state. The heating levels are controlled by the voltage applied across the top and bottom conductors 102, 122, and hence the voltage applied across the heating plug 110.

To read the phase state of the phase change element 120, the variable resistance of the phase change element 120 element is measured. As discussed above, the variable resistance changes with the variable phase. For example, when the variable phase is in an amorphous state, the variable resistance is in a high resistance state (i.e., a resistive state greater than a threshold), and when the variable phase is in a crystalline state, the variable resistance is in a low resistance state (i.e., a resistive state less than the threshold).

Advantageously, the cavities 114 (e.g., air gaps) reduce the leakage of charge laterally from the heating element 116 to the surrounding regions of the insulating structure 104. Further, in some embodiments, such as where the second dielectric layer 108 is silicon nitride, the second dielectric layer 108 further reduces the leakage of charge laterally from the heating element 116 to the surrounding regions of the insulating structure 104. Reducing the leakage of charge advantageously improves the efficiency of the memory cell device and reduces the likelihood of data corruption. Further, reducing the leakage of charge advantageously allows for further node shrinkage since the insulating structure 104 surrounding the heating element 116 can be reduced in size.

Figure 2A:
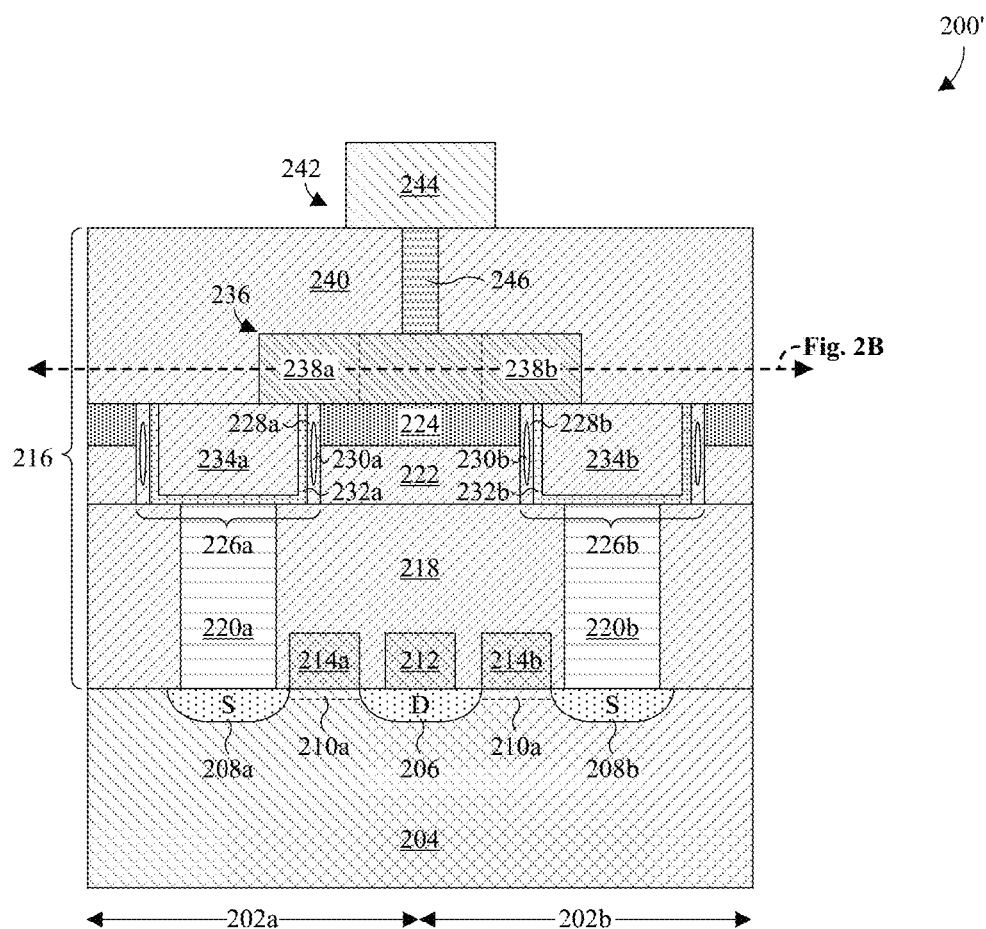
FIG. 2A illustrates a cross-sectional view of some embodiments of a semiconductor structure for a pair of PCM cells with heating elements electrically isolated from laterally surrounding regions of the PCM cells by cavities.
Figure 2B:
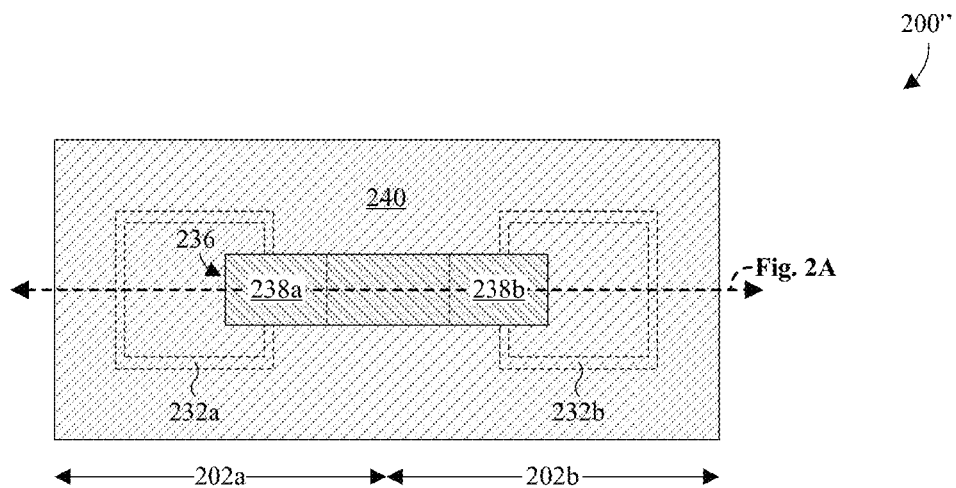
FIG. 2B illustrates a top view of some embodiments of the semiconductor structure of FIG. 2A.

With reference to FIGS. 2A & B, cross-sectional and top views 200', 200" are respectively provided for some embodiments of a semiconductor structure for a pair of PCM cells 202a, 202b. The pair includes a first PCM cell 202a and a second PCM cell 202b. The first and second PCM cells 202 each store unit of data, such as a bit, and are formed over and/or within a semiconductor substrate 204. The semiconductor substrate 204 is, for example, a bulk substrate of silicon, germanium, or group III and group V elements. Alternatively, the semiconductor substrate 204 is, for example, a semiconductor-on-insulator (SOI) substrate.

Source/drain regions 206, 208a, 208b are embedded in a top surface of the semiconductor substrate 204 to define channel regions 210a, 210b corresponding to the PCM cells 202. The channel regions 210 are regions of the semiconductor substrate 204 between the source/drain regions 206, 208 where inversion channels form. Typically, there is a one-to-one correspondence between the channel regions 210 and the PCM cells 202. In some embodiments, the source/drain regions 206, 208 include a drain region 206 common to the PCM cells 202, as well as source regions 208 individual to the PCM cells 202 arranged on opposite sides of the common drain region 206. The source/drain regions 206, 208 can, for example, be p- or n-type doped regions.

In some embodiments, where the PCM cells 202 are connected in a PCM cell array, a bit line (not shown) corresponding to the PCM cells 202 is electrically connected to the common drain region 206 by a bitline interconnect structure 212. Further, word lines 214a, 214b corresponding to the PCM cells 202 and serving as transistor gates are arranged over the channel regions 210 of the corresponding PCM cells 202.

An insulating structure 216 is arranged over the semiconductor substrate 204, and over and around the PCM cells 202. A first dielectric layer 218 of the insulating structure 216 is arranged over the semiconductor substrate 204 with conductive contacts 220a, 220b (serving as bottom conductors) corresponding to the PCM cells 202 extending vertically through the first dielectric layer 218 between top and bottom surfaces of the first dielectric layer 218. The conductive contacts 220 are in electrical communication with the source/drain regions 206, 208, typically the individual source/drain regions 208, of the corresponding PCM cells 202. Further, there is typically a one-to-one correspondence between the conductive contacts 220 and the corresponding PCM cells 202. The conductive contacts 220 are or otherwise include, for example, tungsten, and the first dielectric layer 218 is or otherwise includes, for example, silicon dioxide, silicon nitride, or silicon oxynitride.

Second and third dielectric layers 222, 224 of the insulating structure 216 are arranged over the first dielectric layer 218. The second dielectric layer 222 is arranged over the first dielectric layer 218, and the third dielectric layer 224 is arranged over the second dielectric layaer 222. The second and third dielectric layers 222, 224 are or otherwise include, for example, silicon dioxide, silicon nitride, or silicon oxynitride. For example, the second dielectric layer 222 is silicon dioxide and the third dielectric layer 224 is silicon nitrde.

Heating plugs 226a, 226b of the PCM cells 202 are arranged over corresponding conductive contacts 220. Further, the heating plugs 226 extend vertically through corresponding through holes in the second and third dielectric layers 222, 224 between a top surface of the third dielectric layer 224 and a bottom surface of the second dielectric layer 222 to the corresponding conductive contacts 220. The projection of the through holes onto the top surface of the semiconductor substrate 204 can take any shape, such as such as a rectangle, a circle, a square, a triangle, a ring, etc.

Sidewall structures 228a, 228b of the heating plugs 226 line the sidewalls of corresponding through holes, and include one or more cavities 230a, 230b arranged within the sidewall structures 228. The cavities 230 are filled with a gas, such as, for example, air or nitrogen, and, in some embodiments, the cavities 230 are hermetically sealed. The cavities 230 limit leakage to regions of the insulating structure 216 laterally surrounding the sidewall structures 228. The sidewall structures 228 are or otherwise include a dielectric, such as, for example, silicon dioxide, silicon nitride, or silicon oxynitride.

Heating elements 232a, 232b of the heating plugs 226 and dielectric cores 234a, 234b of the heating plugs 226 are arranged in corresponding through holes between the sidewall structures 228. The heating elements 232 are arranged over the conductive contacts 220 in electrical communication with the conductive contacts 220. Typically, the heating elements 232 conformably line the sidewalls of the sidewall structures 228 and regions of the conductive contact top surfaces below the through holes. The heating elements 232 are or otherwise include, for example, titanium nitride. The dielectric cores 234 are arranged over the heating elements 232 to fill regions of the through hole not taken up by the sidewall structures 228 and the heating elements 232. The dielectric cores 234 electrically isolate opposing sides of the heating elements 232, and are or otherwise include, for example, silicon dioxide, silicon nitride, or silicon oxynitride.

A phase change element 236 is arranged over, typically abutting, the third dielectric layer 224. The phase change element 236 includes phase change regions 238a, 238b individual to the PCM cells 202 and in thermal and electrical communication with corresponding heating elements 232. In some embodiments, only neighboring regions of the heating elements 232 are in electrical and thermal communication with the phase change element 236. The remaining portions of the heating elements 232 are isolated from the phase change element 236 by a fourth dielectric layer 240 of the insulating structure 216 arranged over and around the phase change element 236 and over the third dielectric layer 224. The fourth dielectric layer 240 is or otherwise includes, for example, silicon dioxide, silicon nitride, or silicon oxynitride, and the phase change element 236 is or otherwise includes a chalcogenide compound, such as, for example, GST, GIST, or AIST.

An interconnect structure 242 is arranged over and within the fourth dielectric layer 240. The interconnect structure 242 includes an interconnect layer 244, and a via layer 246 (serving as a top conductor) extending vertically down from the interconnect layer 244 to the phase change element 236 through the fourth dielectric layer 240. The via layer 246 electrically connects the phase change element 236 to the interconnect layer 244. The interconnect layer 244 and the via layer 246 are or otherwise include, for example, a metal, such as copper or tungsten.

Figure 3:
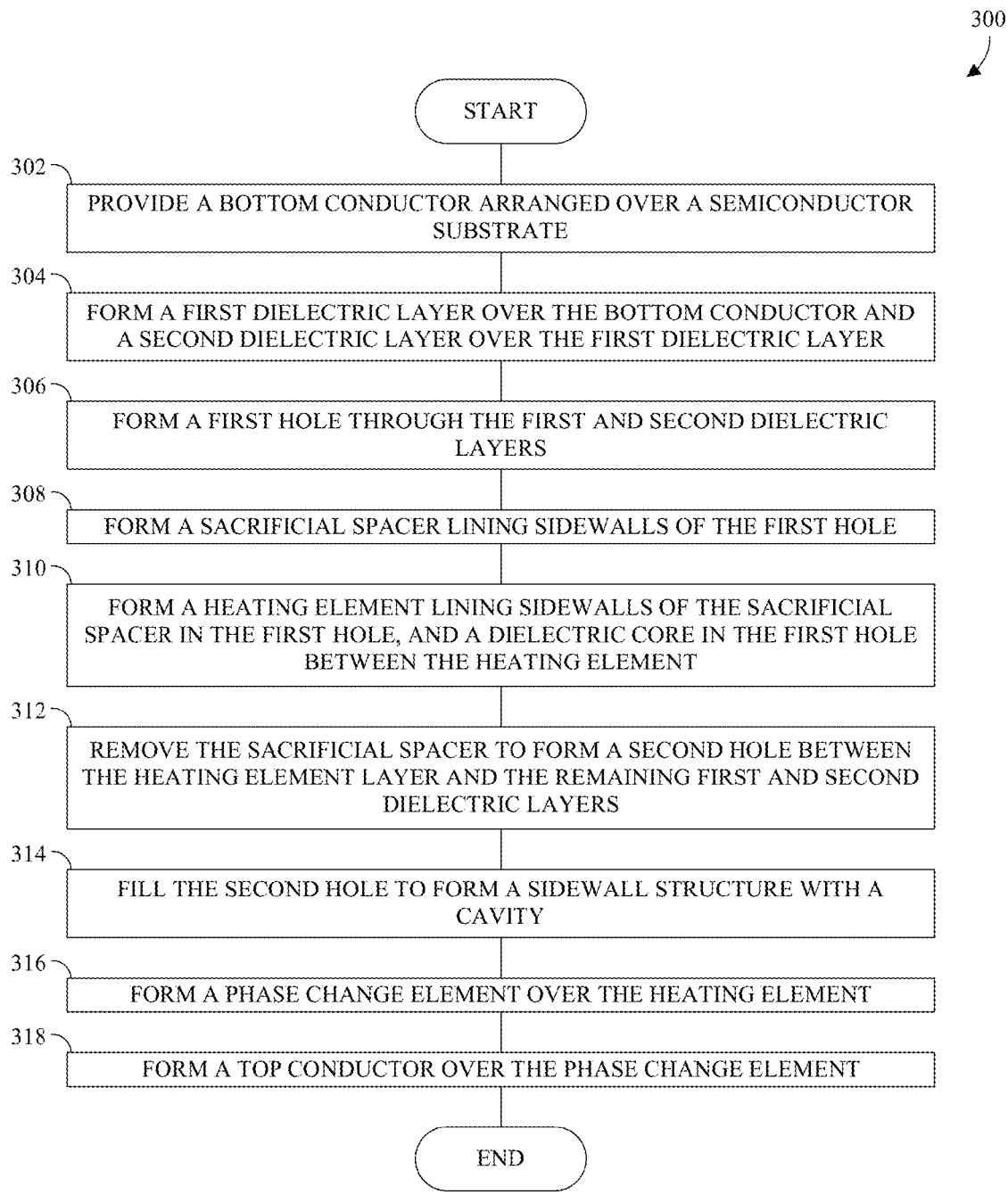
FIG. 3 illustrates a flow chart of some embodiments of a method for manufacturing a semiconductor structure of a PCM cell with a heating element electrically isolated from laterally surrounding regions of the PCM cell by a cavity.

With reference to FIG. 3, a flow chart 300 provides some embodiments of a method for manufacturing a semiconductor structure of a PCM cell with a heating element electrically isolated from laterally surrounding regions of the PCM cell by a cavity. Examples of the semiconductor structure are shown in FIGS. 1A & B and FIGS. 2A & B.

According to the method, a bottom conductor arranged over a semiconductor substrate is provided (Action 302).

A first dielectric layer is formed (Action 304) over the bottom conductor and a second dielectric layer is formed (Action 304) over the first dielectric layer.

A first hole is formed (Action 306) through the first and second dielectric layers.

A sacrificial spacer lining sidewalls of the first hole is formed (Action 308).

A heating element lining sidewalls of the sacrificial spacer is formed (Action 310) in the first hole, and a dielectric core is formed (Action 310) in the first hole between the heating element.

The sacrificial spacer is removed (Action 312) to form a second hole between the conformal heating element layer and the remaining first and second dielectric layers.

The second hole is filled (Action 314) to form a sidewall structure with a cavity.

A phase change element is formed (Action 316) over the heating element.

A top conductor is formed (Action 318) over the phase change element.

During operation, when a voltage is applied across the conformal heating element layer to heat the phase change element, the cavity advantageously reduces or otherwise limits the leakage of charge from the conformal heating element layer to the regions of the remaining first and second dielectric layers laterally surrounding the conformal heating element layer. This, in turn, allows node shrinkage and improved efficiency.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4-21, cross-sectional views of some embodiments of a semiconductor structure of a pair of PCM cells at various stages of manufacture are provided to illustrate the method. Although FIGS. 4-21 are described in relation to the method, it will be appreciated that the structures disclosed in FIGS. 4-21 are not limited to the method, but instead may stand alone as structures independent of the method. Similarly, although the method is described in relation to FIGS. 4-21, it will be appreciated that the method is not limited to the structures disclosed in FIGS. 4-21, but instead may stand alone independent of the structures disclosed in FIGS. 4-21.

FIGS. 4-7 illustrate cross-sectional views 400-700 of some embodiments corresponding to Action 302.

Figure 4:
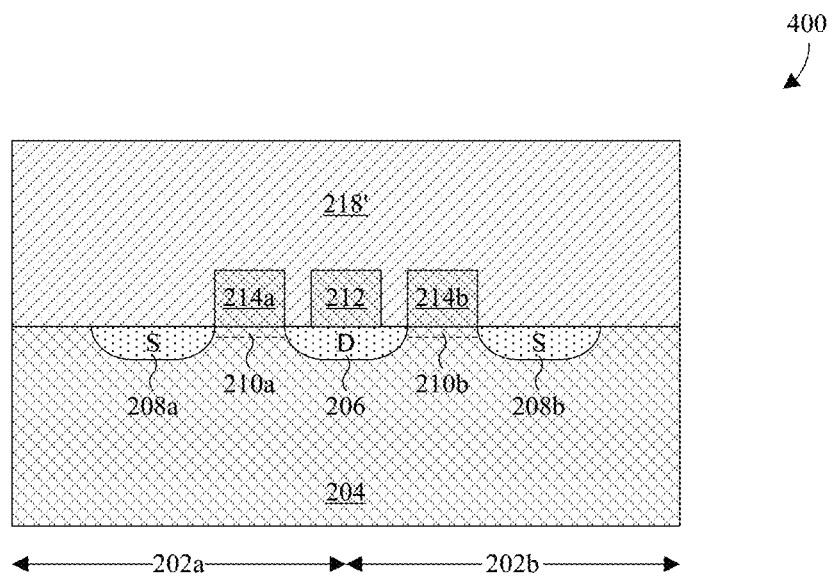
FIGS. 4-21 illustrate a series of cross-sectional and top views of some embodiments of a semiconductor structure of a pair of PCM cells at various stages of manufacture, the pair of PCM cells including heating elements electrically isolated from laterally surrounding regions of the PCM cells by cavities.

As shown by FIG. 4, a semiconductor substrate 204 is provided. The semiconductor substrate 204 is, for example, a bulk substrate of silicon, germanium, or group III and group V elements. Alternatively, the semiconductor substrate 204 is, for example, a semiconductor-on-insulator (SOI) substrate.

Also shown by FIG. 4, source/drain regions 206, 208a, 208b are embedded in a top surface of the semiconductor substrate 204 to define channel regions 210a, 210b corresponding to a pair of PCM cells 202a, 202b. In some embodiments, the source/drain regions 206, 208 include a drain region 206 common to the PCM cells 202, as well as source regions 208 individual to the PCM cells 202 arranged on opposite sides of the common drain region 206. The source/drain regions 206, 208 can, for example, be p- or n-type doped regions.

Also shown by FIG. 4, in some embodiments, where the PCM cells 202 are connected in a PCM cell array, a bit line (not shown) corresponding to the PCM cells 202 is electrically connected to the common drain region 206 by a bitline interconnect structure 212. Further, word lines 214a, 214b corresponding to the PCM cells 202 and serving as transistor gates are arranged over the channel regions 210 of the corresponding PCM cells 202.

Also shown by FIG. 4, a first dielectric layer 218' is arranged over the semiconductor substrate 204 and the source/drain regions 206, 208. Further, in some embodiments, the first dielectric layer 218' is arranged over the bitline interconnect structure 212 and the word lines 214. The first dielectric layer 218' has, for example, a planar top surface. Further, the first dielectric layer 218' is or otherwise includes, for example, silicon dioxide, silicon nitride, or silicon oxynitride.

Figure 5:
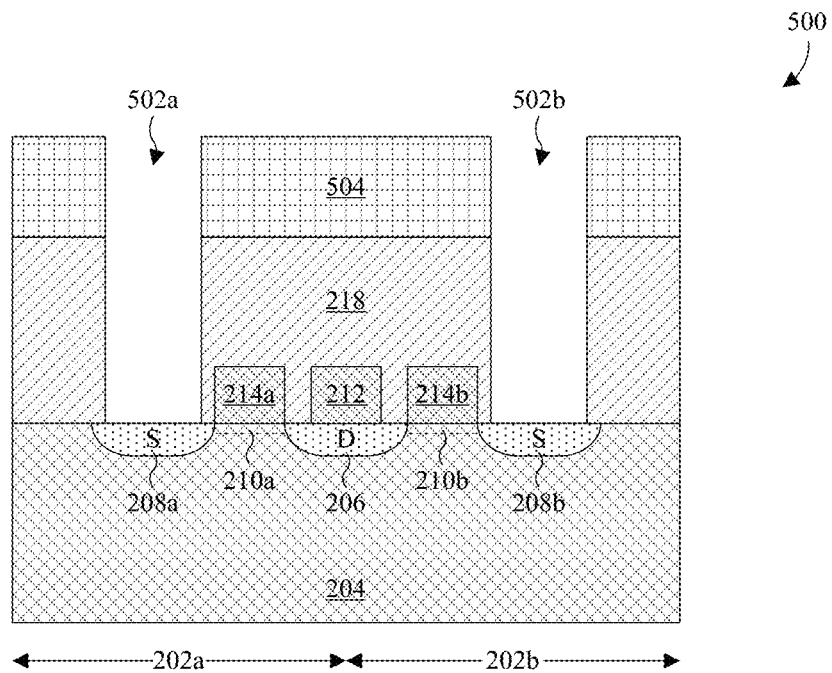

As shown by FIG. 5, a first etch is performed through select portions of the first dielectric layer 218' to form conductive contact holes 502a, 502b corresponding to the PCM cells 202. The conductive contact holes 502 extend between the top surface of the first dielectric layer 218' to source/drain regions 206, 208, typically individual source/drain regions 208, of the corresponding PCM cells 202. In some embodiments, the first etch includes forming a first photoresist layer over a top surface of the first dielectric layer 218', patterning the first photoresist layer, and applying an etchant to the patterned first photoresist layer 504 to form the conductive contact holes 502.

Figure 6:
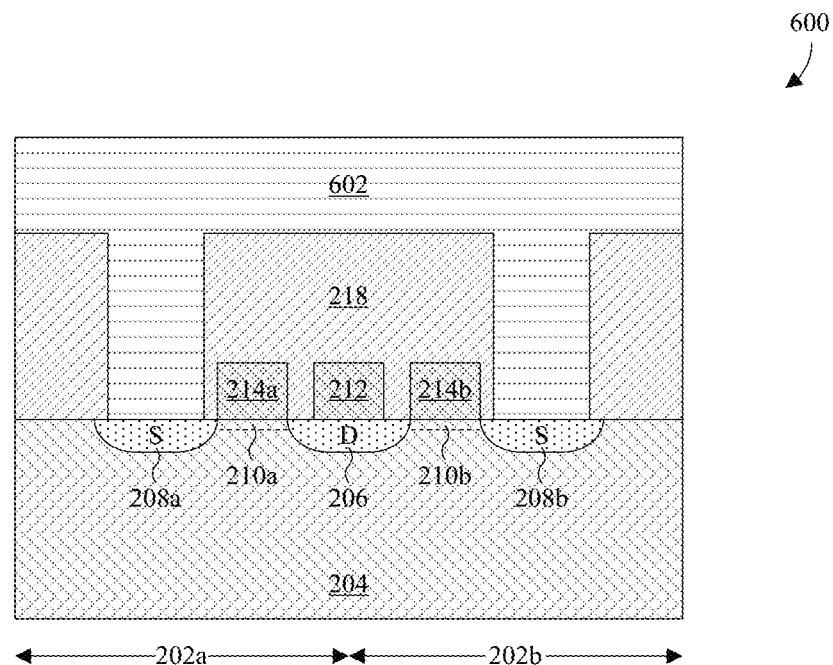

As shown by FIG. 6, a conductive contact layer 602 is formed over the remaining first dielectric layer 218 to fill the conductive contact holes 502. The conductive contact layer 602 is or otherwise includes, for example, tungsten.

Figure 7:
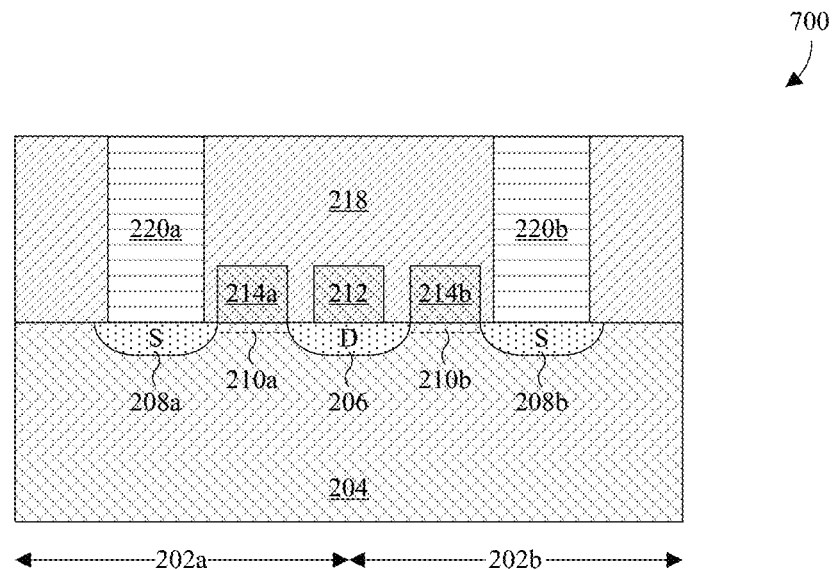

As shown by FIG. 7, a first planarization and/or etch back is performed into the conductive contact layer 602 to a top surface of the remaining first dielectric layer 218. The first planarization and/or etch back forms conductive contacts 220a, 220b corresponding to the PCM cells 202 from the conductive contact layer 602. In some embodiments, the first planarization and/or etch back includes a chemical-mechanical planarization (CMP).

Figure 8:
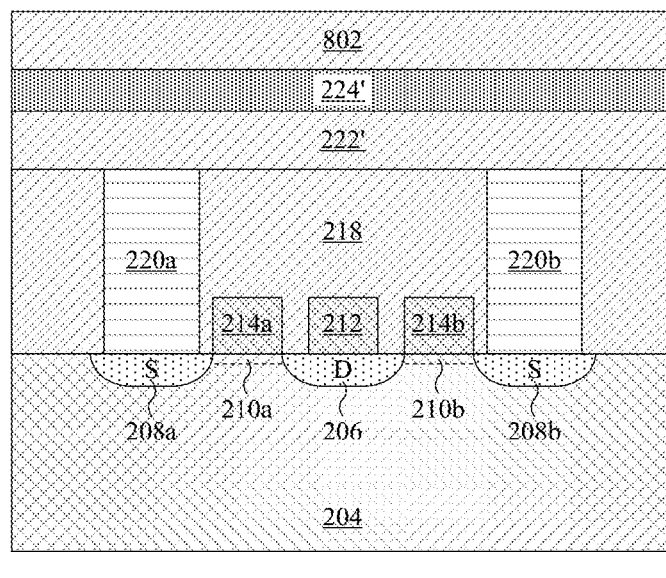

FIG. 8 illustrates a cross-sectional view 800 of some embodiments corresponding to Action 304. As shown by FIG. 8, a second dielectric layer 222', a third dielectric layer 224', and a fourth dielectric layer 802 are stacked or formed in that order over the conductive contacts 220 and the remaining first dielectric layer 218. The second, third and fourth dielectric layers 222', 224', 802 are or otherwise include, for example, silicon dioxide, silicon nitride, or silicon oxynitride. The second dielectric layer 222' is, for example, silicon dioxide, and the third dielectric layer 224' is, for example, silicon nitride.

Figure 9:
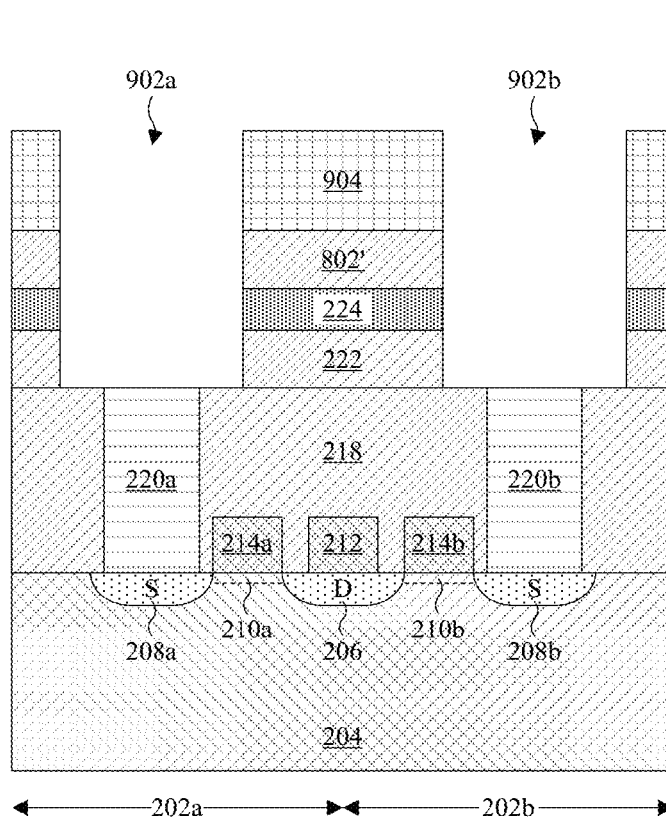
Figure 10:
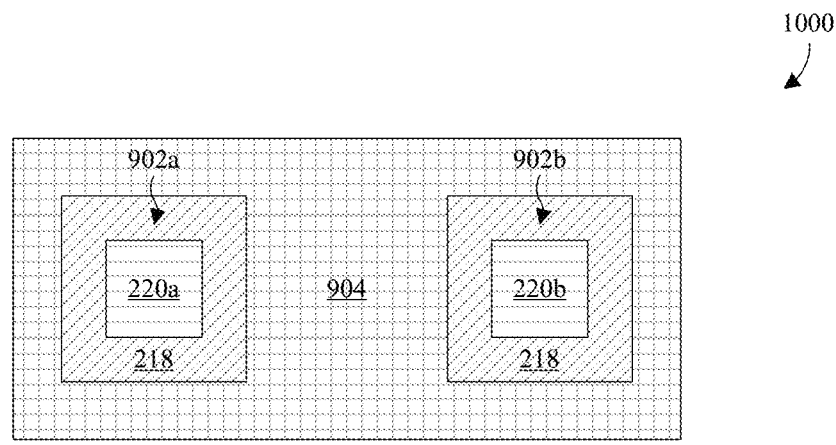

FIGS. 9 and 10 respectively illustrate cross-sectional and top views 900, 1000 of some embodiments corresponding to Action 306. As shown by FIGS. 9 and 10, a second etch is performed through select portions of the second, third and fourth dielectric layers 222', 224', 802 to form heating plug holes 902a, 902b corresponding to the PCM cells 202. The heating plug holes 902 extend between the top surface of the fourth dielectric layer 802 to conductive contacts 220 of the corresponding PCM cells 202. In some embodiments, the second etch includes forming a second photoresist layer over a top surface of the fourth dielectric layer 802, patterning the second photoresist layer, and applying an etchant to the patterned second photoresist layer 904 to form the heating plug holes 902.

Figure 11:
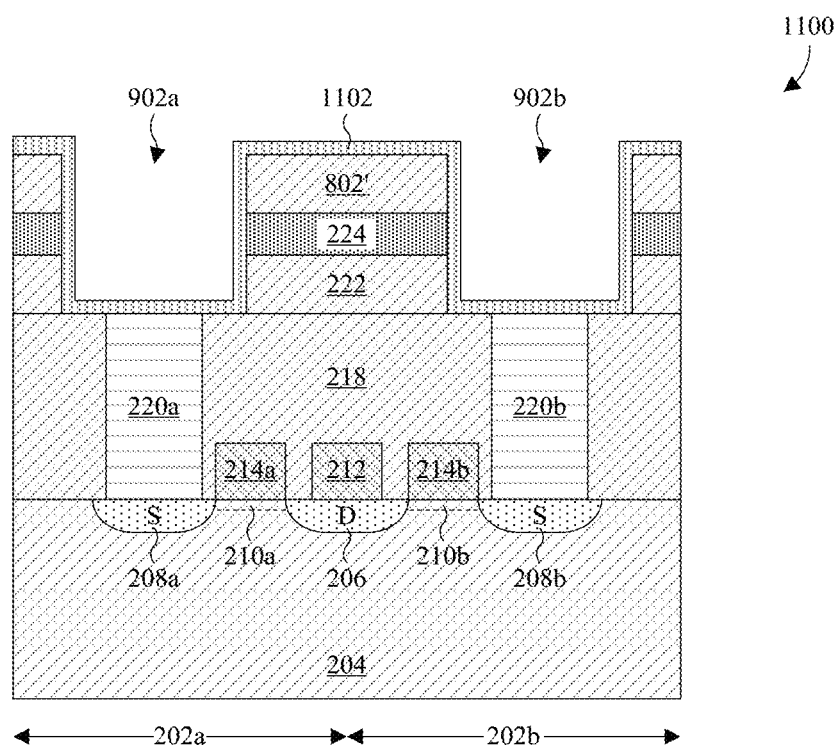
Figure 12:
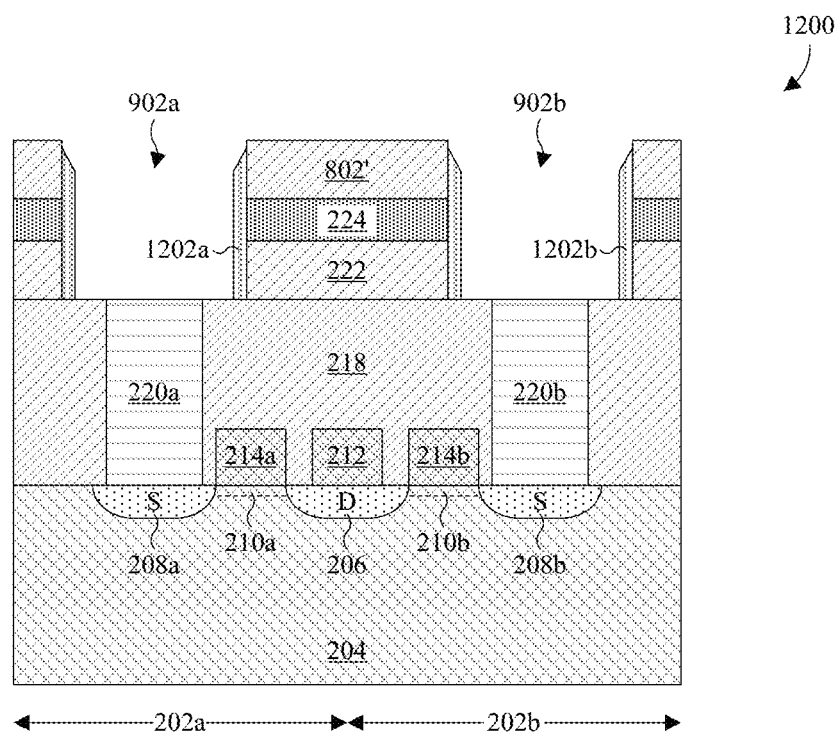

FIGS. 11 & 12 illustrate cross-sectional views 1100 & 1200 of some embodiments corresponding to Action 308.

As shown by FIG. 11, a sacrificial spacer layer 1102 is formed over the remaining fourth dielectric layer 802' and conformally lining the heating plug holes 902. The ratio of the combined height of the remaining second and third dielectric layers 222, 224 to the thickness of the sacrificial spacer layer 1102 is suitably greater than or equal to about one. In some embodiments, the sacrificial spacer layer 1102 is an ash removable deposition (ARD).

As shown by FIG. 12, a third etch is performed through select portions of the sacrificial spacer layer 1102 to remove horizontal stretches of the sacrificial spacer layer 1102, while leaving vertical stretches lining sidewalls of the heating plug holes 902. In some embodiments, the third etch is performed through application of an etchant for the approximate time needed to remove the thickness of the sacrificial spacer layer 1102. The third etch results in the formation of sacrificial spacers 1202a, 1202b corresponding to the PCM cells 202 lining the sidewalls of the heating plug holes 902.

Figure 13:
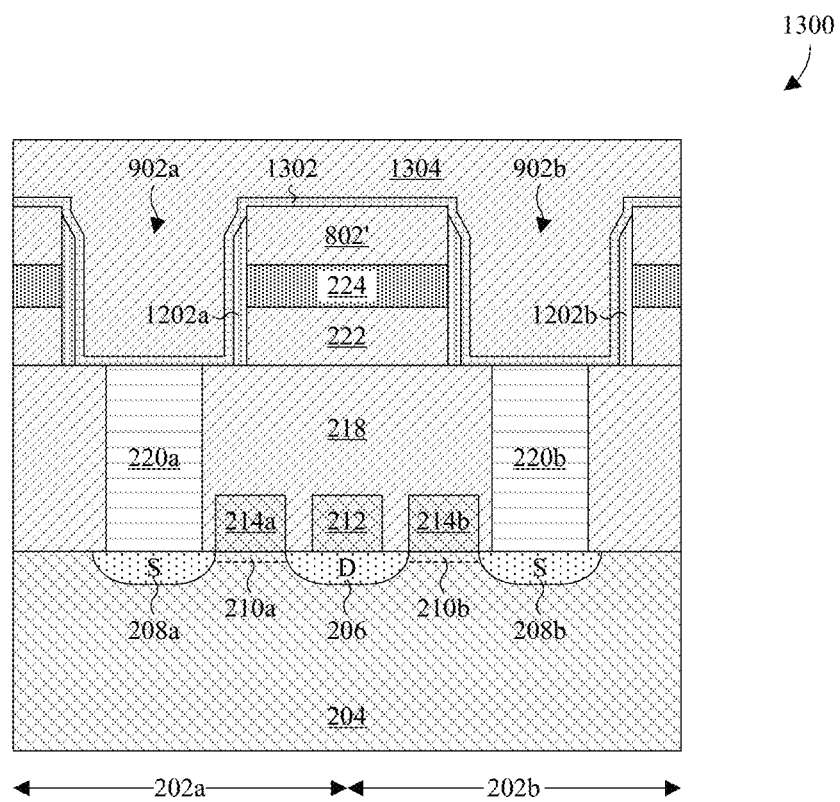
Figure 14:
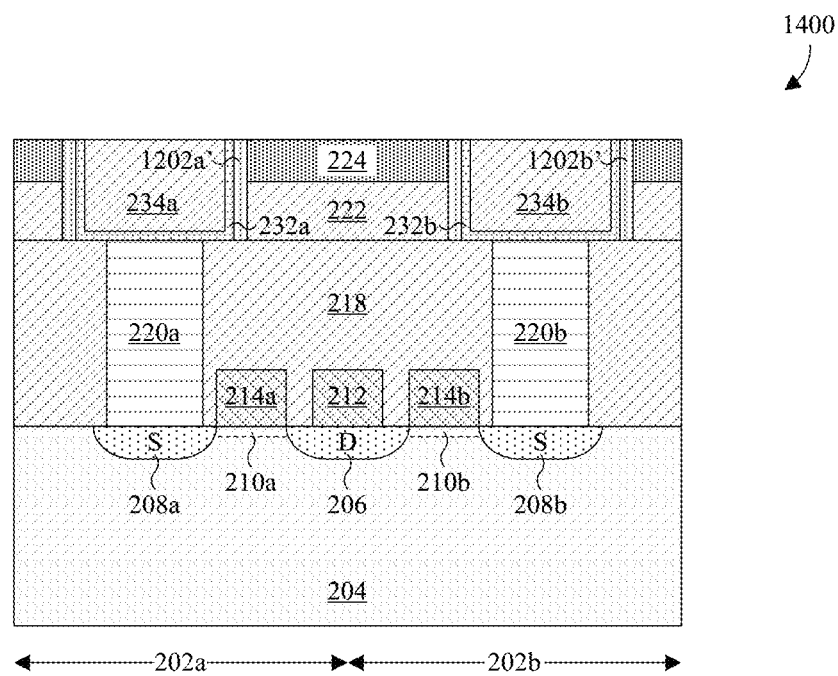

FIGS. 13 & 14 illustrate cross-sectional views 1300 & 1400 of some embodiments corresponding to Action 310.

As shown by FIG. 13, a heating element layer 1302 is formed over the remaining fourth dielectric layer 802' and conformally lining the heating plug holes 902 over the sacrificial spacers 1202. The heating element layer 1302 is or otherwise includes, for example, titanium nitride. Further, the heating element layer 1302 is, for example, formed by atomic layer deposition.

Also shown by FIG. 13, a fifth dielectric layer 1304 is formed over the heating element layer 1302 and filling the heating plug holes 902. The fifth dielectric layer 1304 is or otherwise includes, for example, silicon dioxide, silicon nitride, or silicon oxynitride.

As shown by FIG. 14, a second planarization and/or etch back is performed into the fifth dielectric layer 1304, the heating element layer 1302, and the sacrificial spacers 1202, as well as through the remaining fourth dielectric layer 802', to a top surface of the remaining third dielectric layer 224. The second planarization and/or etch back results in dielectric cores 234a, 234b corresponding to the PCM cells 202 from the fifth dielectric layer 1304. Further, the second planarization and/or etch back results in heating elements 232a, 232b corresponding to the PCM cells 202 from the heating element layer 1302. In some embodiments, the second planarization and/or etch back includes a CMP.

Figure 15:
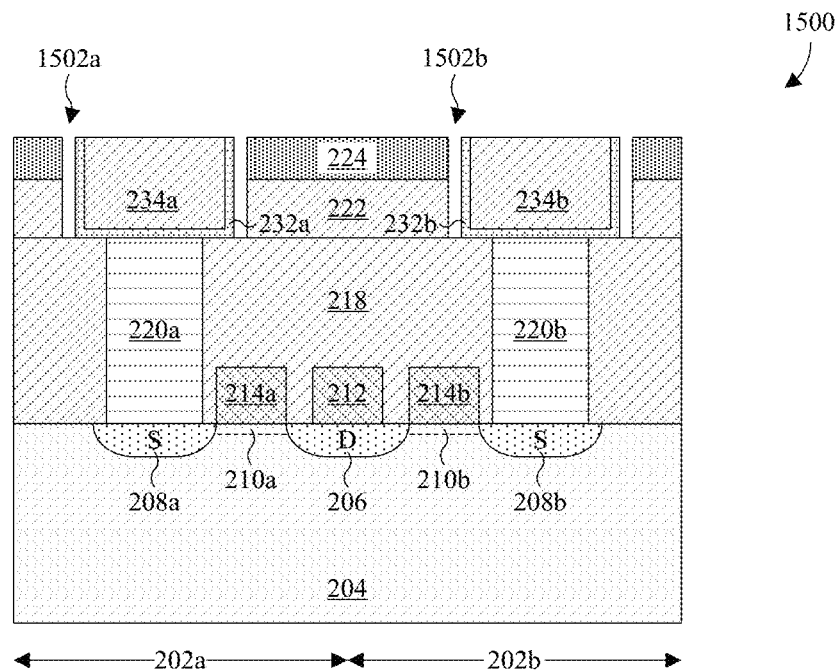

FIG. 15 illustrates a cross-sectional view 1500 of some embodiments corresponding to Action 312. As shown by FIG. 15, the remaining sacrificial spacers 1202' are removed to form spacer holes 1502a, 1502b corresponding to the PCM cells 202. The spacer holes 1502 extend through the remaining second and third dielectric layers 222, 224 between a top surface of the remaining third dielectric layer 224 and a bottom surface of the remaining second dielectric layer 222. In some embodiments, such as where the remaining sacrificial spacers 1202' are an ARD, the removal is performed with plasma ashing. The spacer holes 1502 typically have an aspect ratio (i.e., a ratio of height to width) between about four and nine.

Figure 16:
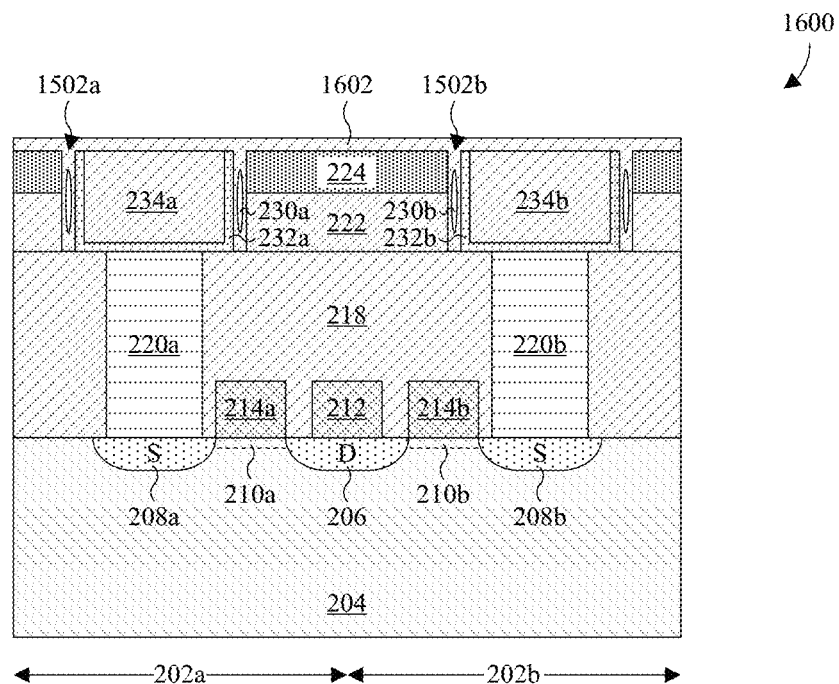
Figure 17:
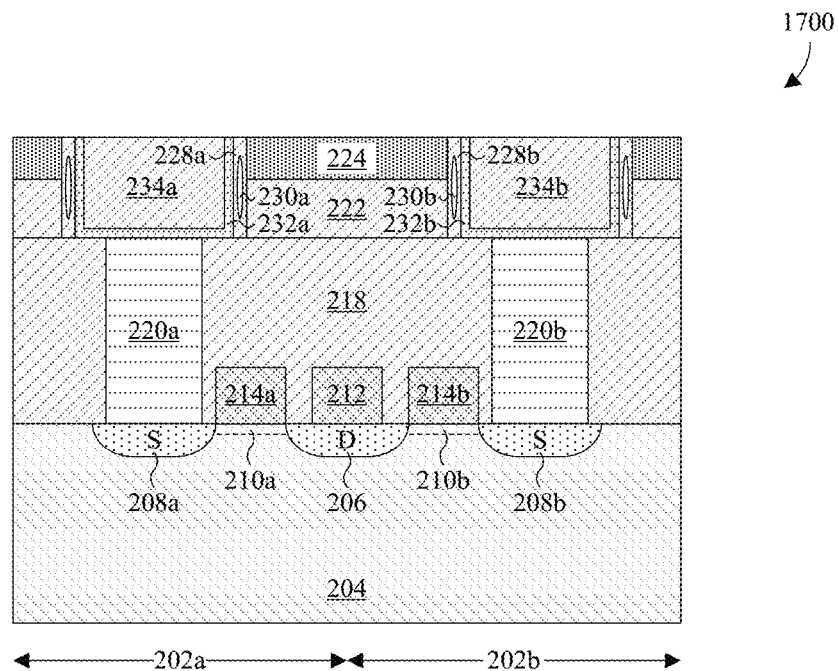

FIGS. 16 & 17 illustrate cross-sectional views 1600 & 1700 of some embodiments corresponding to Action 314.

As shown by FIG. 16, a sixth dielectric layer 1602 is formed over the remaining third dielectric layer 224 and filling the spacer holes 1502. The sixth dielectric layer 602 has, for example, a thickness of about 200-600 Angstroms. Because the spacer holes 1502 typically have an aspect ratio between about four and nine, and the sixth dielectric layer 602 typically has a thickness of about 200-600 Angstroms, cavities 230a, 230b corresponding to the PCM cells 202 form in the spacer holes 1502 within the sixth dielectric layer 1602. The sixth dielectric layer 1602 is or otherwise includes, for example, silicon nitride, silicon dioxide, or silicon oxynitride.

As shown by FIG. 17, a third planarization and/or etch back is performed into the sixth dielectric layer 1602 to a top surface of the remaining third dielectric layer 224. The third planarization and/or etch back results in sidewall structures 228a, 228b corresponding to the PCM cells 202 from the sixth dielectric layer 1602. The sidewall structures 228 include the cavities 230, which advantageously provide electrical isolation between the heating elements 232 and surrounding regions of the remaining second and third dielectric layers 222, 224. In some embodiments, the third planarization and/or etch back includes a CMP.

Figure 18:
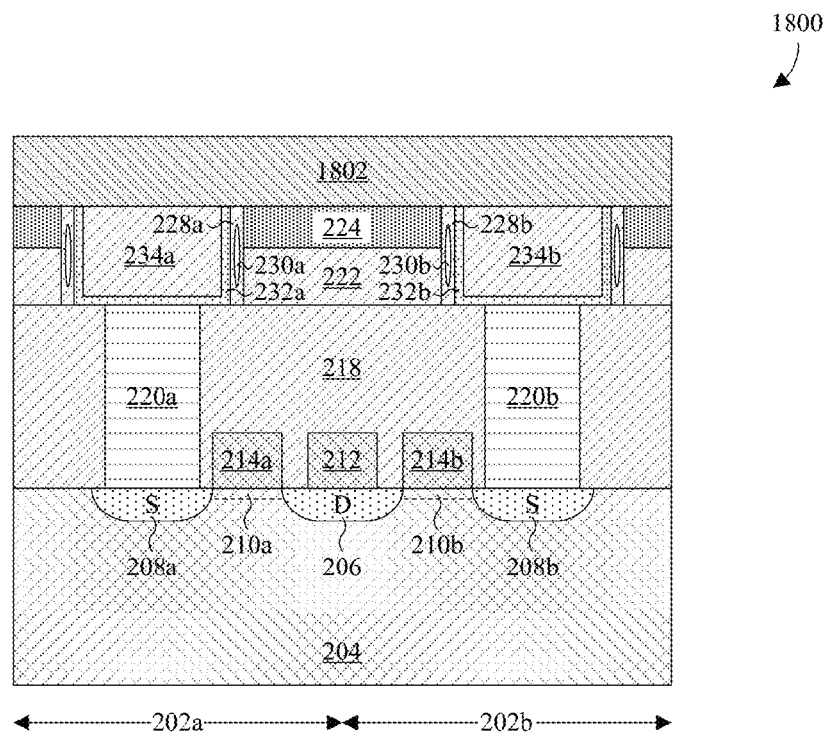
Figure 19:
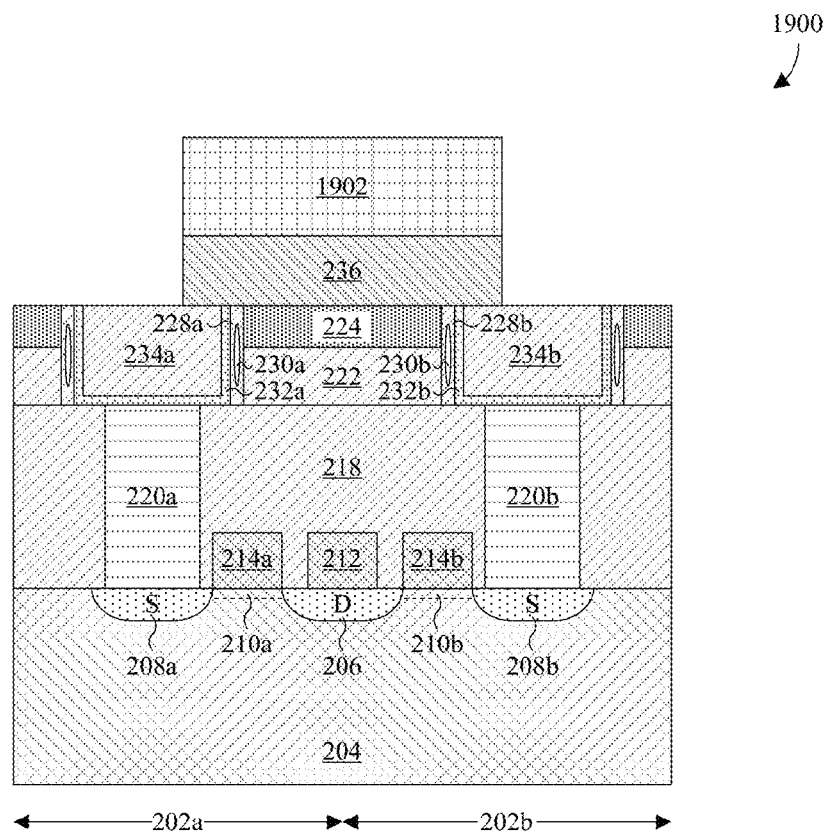
Figure 20:
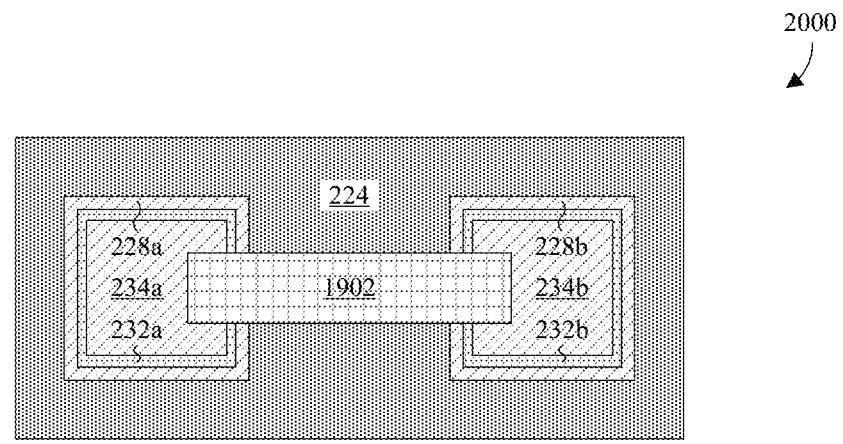

FIGS. 18-20 illustrate cross-sectional and top views 1800, 1900, 2000 of some embodiments corresponding to Action 316.

As shown by FIG. 18, a phase change layer 1802 is formed over the remaining third dielectric layer 224, the dielectric cores 234, the sidewall structures 228 and the heating elements 232. The phase change layer 1802 reversibly switches between different phases, with different resistances, depending upon the level of applied heat. The phase change layer 1802 is or otherwise includes, for example, GST or GIST.

As shown by FIGS. 19 and 20, a fourth etch is performed through select portions of the phase change layer 1802 to form a phase change element 236 over the heating elements 232. In some embodiments, the phase change element 236 is arranged over only portions of the heating elements 232. For example, as illustrated, the phase change element 236 can extend between neighboring regions of the heating elements 232. Further, in some embodiments, the fourth etch includes forming a third photoresist layer over a top surface of the phase change layer 1802, patterning the third photoresist layer, and applying an etchant to the patterned second photoresist layer 1902 to form the phase change element 236.

Figure 21:
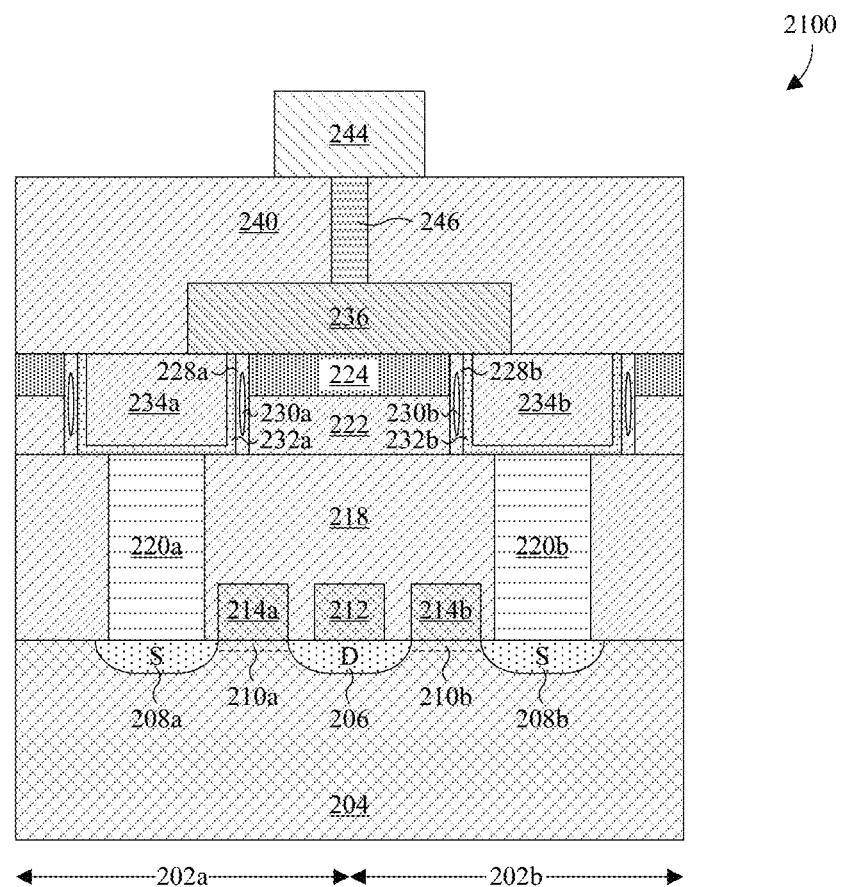

FIG. 21 illustrates a cross-sectional view 2100 of some embodiments corresponding to Action 318. As shown by FIG. 21, a seventh dielectric layer 240 is formed over and surrounding the phase change element 236 with a via hole extending therethrough to the phase change element 236. Also shown, a via layer 246 fills the via hole and an interconnect layer 244 is formed in electrical communication with the via layer 246 over the seventh dielectric layer 240. The interconnect layer 244 and the via layer 246 are or otherwise include, for example, a metal, such as copper or tungsten.

Thus, as can be appreciated from above, the present disclosure provides a semiconductor structure for a PCM cell. A dielectric region is arranged between first and second conductors. A heating plug is arranged within a hole extending through the dielectric region to the first conductor. The heating plug includes a heating element running along sidewalls of the hole, and a sidewall structure including a cavity arranged between the heating element and the sidewalls. A phase change element is in thermal communication with the heating plug and arranged between the heating plug and the second conductor.

In other embodiments, the present disclosure provides a method of manufacturing a semiconductor structure for a PCM cell. A dielectric region is formed over a first conductor. A hole is formed extending through the dielectric region to the first conductor. A heating plug is formed within the hole. The heating plug includes a heating element running along sidewalls of the hole, and includes a sidewall structure with a cavity arranged between the heating element and the sidewalls. A phase change element is formed in thermal communication with the heating plug over the heating plug. A second conductor is formed over the phase change element.

In yet other embodiments, the present disclosure provides a semiconductor structure for a pair of PCM cells. A semiconductor substrate has a source/drain region common to a pair of PCM cells, and has first and second source/drain regions arranged on opposite sides of the common source/drain region and individual to the PCM cells. First and second contacts corresponding to the PCM cells extend vertically up from the individual source/drain regions through a first dielectric layer. First and second heating plugs correspond to the first and second contacts. The first and second heating plugs are arranged over the corresponding first and second conductors within corresponding first and second holes. The first and second holes extend through second and third dielectric layers arranged over the first dielectric layer. First and second phase change regions correspond to the first and second heating plugs. The first and second phase change regions are in thermal communication with the corresponding first and second heating plugs and arranged between the corresponding first and second heating plugs and a second conductor. The first and second heating plugs include corresponding first and second heating elements laterally spaced from the second and third dielectric layers by cavities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for a pair of phase change memory (PCM) cells, the semiconductor structure comprising:
    a dielectric region arranged between first and second conductors;
    a first heating plug arranged within a first hole extending through the dielectric region to the first conductor, wherein the first heating plug includes:
        a heating element running along sidewalls of the first hole; and
        a sidewall structure including a cavity arranged between the heating element and the sidewalls;
    a second heating plug arranged within a second hole extending through the dielectric region, and arranged laterally adjacent to the first heating plug; and
    a phase change element in thermal communication with the first and second heating plugs and arranged between the first heating plug and the second conductor, wherein the phase change element extends laterally between neighboring sides of the first and second heating plugs, such that the phase change element is only shared among the first and second heating plugs, wherein the phase change element partially covers the first and second heating plugs and comprises opposing ends respectively confined directly over the first and second heating plugs, wherein the entire phase change element is only in physical contact with the second conductor, the first and second heating plugs, and dielectric materials surrounding the phase change element, and wherein a contact area between the second conductor and the phase change element is less than a top surface area of the phase change element.

2. The semiconductor structure according to claim 1, wherein the first heating plug further includes:
    a dielectric core arranged between sidewalls of the heating element.

3. The semiconductor structure according to claim 1, wherein the dielectric region includes:
    a first dielectric layer comprising silicon dioxide; and
    a second dielectric layer arranged between the first dielectric layer and the phase change element, the second dielectric layer comprised of silicon nitride.

4. The semiconductor structure according to claim 1, wherein the heating element is configured to generate heat to change the phase of the phase change element.

5. The semiconductor structure according to claim 1, wherein a ratio of height to width of the sidewall structure is between about four and nine.

6. The semiconductor structure according to claim 1, wherein the cavity is at least one of hermetically sealed and an air gap.

7. The semiconductor structure according to claim 1, further comprising:
    a dielectric layer covering the dielectric region and the first and second heating plugs; and
    an interconnect layer arranged over the dielectric layer and electrically coupled to the phase change element by the second conductor, wherein the second conductor is arranged in the dielectric layer and extends from the interconnect layer to an intermediate point of the phase change element that is laterally spaced between the first and second heating plugs.

8. A semiconductor structure for a pair of phase change memory (PCM) cells, the semiconductor structure comprising:
    a semiconductor substrate having a source/drain region common to a pair of PCM cells, and having first and second source/drain regions arranged on opposite sides of the common source/drain region and individual to the PCM cells;
    first and second contacts corresponding to the PCM cells extending vertically up from the individual source/drain regions through a first dielectric layer;
    first and second heating plugs corresponding to the first and second contacts, the first and second heating plugs arranged over the corresponding first and second contacts within corresponding first and second holes, the first and second holes extending through second and third dielectric layers arranged over the first dielectric layer; and
    a phase change element extending laterally between the first and second heating plugs, wherein the phase change element comprises first and second phase change regions corresponding to the first and second heating plugs, wherein the first and second phase change regions are in thermal communication with the corresponding first and second heating plugs and are arranged between the corresponding first and second heating plugs and a conductor, wherein the phase change element is only shared among the first and second heating plugs, such that the entire phase change element is only in physical contact with the conductor, the first and second heating plugs, and dielectric materials surrounding the phase change element, and wherein a contact area between the conductor and the phase change element is less than a top surface area of the phase change element;
    wherein the first and second heating plugs include corresponding first and second heating elements laterally spaced from the second and third dielectric layers by cavities, wherein the first and second heating plugs further include corresponding dielectric cores laterally enclosed by and contacting respective interior sidewalls of the first and second heating elements, wherein the first or second heating plug is configured to change a phase of the phase change element at an interface with the phase change element, and wherein opposite ends of the phase change element respectively terminate directly over the dielectric cores.

9. The semiconductor structure according to claim 8, wherein the first and second heating plugs further comprise:
corresponding sidewall structures arranged between sidewalls of the first and second holes and outer sidewalls of the first and second heating elements, wherein the sidewall structures comprise the cavities.

10. The semiconductor structure according to claim 8, wherein the second dielectric layer comprises silicon dioxide, wherein the third dielectric layer is arranged between the second dielectric layer and the first and second phase change regions, and wherein the third dielectric layer comprises silicon nitride.

11. The semiconductor structure according to claim 8, wherein the cavities are hermetically sealed.

12. The semiconductor structure according to claim 8, wherein the first and second heating plugs are confined to the first and second holes.

13. The semiconductor structure according to claim 8, wherein the phase change element extends laterally between the first and second heating plugs along its length, and wherein a contact area between the first or second heating element and the phase change element is less than the top surface area of the phase change element.

14. A phase change memory (PCM) cell structure comprising:
a dielectric region arranged between first and second conductors, and comprising a first hole extending through the dielectric region and a second hole extending through the dielectric region;
a first heating plug arranged within the first hole, and comprising a first heating element and a first dielectric layer, wherein the first dielectric layer comprises a first cavity that is arranged between sidewalls of the first heating element and sidewalls of the first hole;
a second heating plug arranged within the second hole, and comprising a second heating element and a second dielectric layer, wherein the second dielectric layer comprises a second cavity that is arranged between sidewalls of the second heating element and sidewalls of the second hole;
a phase change element in thermal communication with the first and second heating plugs and arranged between the first and second heating plugs and the second conductor, wherein the phase change element extends laterally between neighboring sides of the first and second heating plugs, such that the phase change element is only shared among the first and second heating plugs, wherein the entire phase change element is only in physical contact with the first and second heating plugs, the second conductor, and dielectric materials surrounding the phase change element, wherein the phase change element contacts the first heating element at only one side of the first heating element and the second heating element at only one side of the second heating element, and wherein a contact area between the second conductor and the phase change element is less than a top surface area of the phase change element;
a third dielectric layer covering the dielectric region and the first and second heating plugs; and
an interconnect layer arranged over the third dielectric layer and electrically coupled to the phase change element by the second conductor, wherein the second conductor is arranged in the third dielectric layer and extends from the interconnect layer to an intermediate point of the phase change element, and wherein the intermediate point is laterally spaced between the first and second heating plugs.

15. The PCM cell structure according to claim 14, wherein the first heating element has a U-shaped profile and abuts the first conductor.

16. The PCM cell structure according to claim 14, wherein the first heating plug is confined to the first hole, and wherein the first dielectric layer is confined to the sidewalls of the first hole.

* * * * *